United States Patent
Sawada et al.

(10) Patent No.: US 7,033,844 B2
(45) Date of Patent: Apr. 25, 2006

(54) WAFER INCLUDING AN IN-CONTAINING-COMPOUND SEMICONDUCTOR SURFACE LAYER, AND METHOD FOR PROFILING ITS CARRIER CONCENTRATION

(75) Inventors: Shigeru Sawada, Itami (JP); Takashi Iwasaki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 177 days.

(21) Appl. No.: 10/065,552

(22) Filed: Oct. 29, 2002

(65) Prior Publication Data

US 2003/0085407 A1    May 8, 2003

(30) Foreign Application Priority Data

Nov. 6, 2001    (JP)    ............................. 2001-340527

(51) Int. Cl.
G01R 31/26    (2006.01)
(52) U.S. Cl. .............................. 438/14; 438/16; 438/18
(58) Field of Classification Search ............. 438/14–18
See application file for complete search history.

(56) References Cited

U.S. PATENT DOCUMENTS 3,803,489 A * 4/1974 Miller ........................ 324/765
5,237,266 A * 8/1993 Endredi et al. ............. 324/767
6,501,101 B1 * 12/2002 Murakami et al. ............ 257/79

OTHER PUBLICATIONS

R. T. Green, D. K. Walker, and C. M. Wolfe, "An Improved Method for the Electrochemical C-V Profiling of Indium Phosphide," *J. Electrochem. Soc.*, vol. 133, 1986, pp. 2278-2283.
V. Gopal, et al., "Electrochemical Capacitance Voltage Profiling of the Narrow Band Gap Semiconductor InAs," Journal of Electronic Materials, vol. 29, No. 11, 2000 pp. 1333-1339.
H. Yoshitake, "CV Evaluation Apparatus," Collection of Toshiba Technology Disclosure, vol. 16-17, Mar. 23, 1998, p. 139.

* cited by examiner

*Primary Examiner*—Long Pham
*Assistant Examiner*—Wai-Sing Louie
(74) *Attorney, Agent, or Firm*—James W. Judge

(57) ABSTRACT

Method for non-invasively profiling carrier concentration in In-containing compound semiconductor wafers that enables employing the profiled wafers themselves in semiconductor device applications. The method, which using the C/V technique profiles carrier concentration in wafers including an In-containing-compound semiconductor surface layer, is characterized in non-invasively profiling carrier concentration by contacting a liquid electrode on the wafer surface, and without using photo-etching, employing an applied voltage that is up to a voltage surpassing 10V.

5 Claims, 1 Drawing Sheet

WAFER INCLUDING AN IN-CONTAINING-COMPOUND SEMICONDUCTOR SURFACE LAYER, AND METHOD FOR PROFILING ITS CARRIER CONCENTRATION

BACKGROUND OF INVENTION

1. Field of the Invention

The present invention relates to compound semiconductor wafers, and in particular to the profiling of carrier concentration in In-containing compound semiconductor wafers.

2. Description of the Background Art

Well-known methods of profiling carrier concentration within semiconductor wafers may be grossly divided into methods that measure Hall coefficient, and the C/V technique, which measures capacitance/voltage characteristics.

With the Hall-coefficient measuring methods, the carrier concentration of the semiconductor wafer cannot be measured nondestructively since a rectangular test piece for measuring must be cut out of a semiconductor wafer. This means that the carrier concentration of wafers themselves into which semiconductor devices are built cannot be profiled. Likewise, the Hall coefficient pertains to the test piece as a whole, and does not allow profiling of carrier concentration locally within the test piece.

In terms of the C/V technique, ordinarily a Schottky diode that is metal vapor-deposited onto the semiconductor wafer is formed, and an ac voltage of minute amplitude is superimposed onto a dc reverse-bias voltage to measure the C/V characteristics. Being that the region within the semiconductor wafer on which the Schottky diode for measuring C/V characteristics is formed cannot thereafter be employed for semiconductor device formation, the routine C/V technique cannot be said to be a non-invasive profiling method.

Likewise, with regard to compound semiconductor wafers, the routine C/V technique is not a very attractive method. The reason why is that in respect of compound semiconductor wafers, the barrier height of Schottky diodes is low, oxide-film formation cannot be controlled, and further, problems such as chemical reactions between metals and the compound semiconductor can arise.

Therein, to profile carrier concentration in a compound semiconductor wafer, electrochemical C/V techniques utilizing an electrolyte as an electrode have been used. (See for example, *J. Electrochem. Soc.*, Vol. 133, 1986, pp. 2278–2283.)

Reference is made to FIG. 2, a block diagram schematically illustrating a conventional electrochemical C/V technique. In the electrochemical C/V analyzer set out in FIG. 2, the interior of a cell 1 is filled with an electrolyte 2 such as an aqueous HCl solution. A calomel electrode 3 as a reference electrode is inserted into the cell 1. The cell 1 has a ring-shaped opening 1a, and a compound semiconductor wafer 4 whose C/V characteristics are to be measured is contacted with the electrolyte 2 via the opening 1a, wherein the electrolyte 2 acts as one of the electrodes. A probe electrode 5 as the other electrode is contacted on the compound semiconductor wafer 4. An electrical analyzing unit 6 supplies a dc reverse-bias voltage and around a 3000-Hz ac superimposed voltage to the reference electrode 3 and the probe electrode 5 to measure the C/V characteristics.

In a depth w from the surface where the compound semiconductor wafer 4 is in contact with the electrolyte electrode 2, the carrier concentration $N(cm^{-3})$ within the wafer may be determined using the following formula (1).

$$N(w) = (-C^3/q\epsilon A^2)(dC/dV)^{-1} \qquad (1)$$

Herein, w expresses the depth from the wafer surface to the edge of the depletion layer. That is, $N(w)$ expresses the carrier concentration N in the depth w from the wafer surface. Likewise, C expresses capacitance measured by a dc reverse-bias voltage; q, electronic charge; $\epsilon$, permittivity; A, measurement area; and dC, variation in capacitance depending on variation dV in the superimposed ac voltage. Here, the depth w may be found from the following formula (2).

$$w = \epsilon A/C \qquad (2)$$

In terms of an electrochemical C/V technique utilizing an electrolyte electrode as described above, profiling carrier concentration through depths of more than 3 µm is difficult unless a reverse-bias voltage that exceeds 10 V is applied. However, wherein an electrolyte electrode such as, e.g., an aqueous HCl solution is utilized, electrical breakdown of the electrolyte sets in when a high reverse-bias voltage in excess of 10 V is applied, giving rise to problems in that bubbles of hydrogen and oxygen cling to the wafer surface and make it impossible to measure the C/V characteristics. Applying too high a voltage can also give rise to problems in that the leakage current grows large, and electrolyte leakage occurs.

Consequently, in conventional electrochemical C/V analyzers, the maximum value of the reverse-bias applied voltage is in general limited to 10 V. To work around this limitation, carrier concentration through depths of more than 3 µm is profiled by repeating C/V analysis using an applied voltage of under 10 V, and wafer surface etching using a photo-etching process.

This means that, as shown in FIG. 2, the cell 1 in a conventional electrochemical C/V analyzer is furnished with a light-receiving window 1b. By shining light 7 onto the wafer surface where it contacts the electrolyte 2 at the ring-shaped opening 1a, the electrolyte 2 works as an etchant and the wafer surface is removed to a predetermined depth by photo-etching. Then a succeeding C/V analysis is performed with the surface freshly formed by the etching as a new reference.

With this method of profiling carrier concentration by repeating C/V analysis and photo-etching in this way, time is required for the etching; for a C/V analysis in order to profile carrier-concentration/distribution about 2 µm in the depth direction, around 1 hour is necessary. Furthermore, being that the photo-etched region cannot thereafter be employed for semiconductor device formation, the conventional electrochemical C/V technique cannot be said to be a non-invasive profiling method.

Moreover, In-containing compound semiconductor wafers for forming optical-communications photo detectors must be furnished with an epitaxial layer 5 to 8 µm in thickness, and if the carrier concentration within an epitaxial layer that thick is profiled by the repeating of C/V analysis and photo-etching processes, the C/V analysis alone ends up taking around 3 to 4 hours. Still further, performing photo-etching with consistency is not easy, and gaining high precision in C/V analysis is difficult.

SUMMARY OF INVENTION

Taking the above-described issues in the prior art into consideration, an object of the present invention is to develop a method of non-invasively profiling carrier concentration/distribution in a short time to a depth of several µm within an In-containing compound semiconductor wafer, and at the same time to provide the profiled wafer itself for use directly in device fabrication.

A method as defined by one mode of the present invention, which employing the C/V technique profiles carrier concentration in a wafer including an In-containing-compound semiconductor surface layer, is characterized in non-invasively profiling carrier concentration by contacting a liquid electrode on the wafer surface, and without using a photo etching process, employing an applied voltage that is up to a voltage surpassing 10V.

Here, an aqueous EDTA solution is preferably utilized as the liquid electrode. Likewise, the aqueous EDTA solution preferably contains 80% or more EDTA. Furthermore, liquid tiron or a metal gallium (Ga) melt may be utilized as the liquid electrode.

A method as defined by one further mode of the present invention, which employing the C/V technique profiles carrier concentration in a wafer including an In-containing-compound semiconductor surface layer, is characterized in contacting a metal Ga melt on the wafer surface, then solidifying the metal Ga melt to form a metal Ga electrode, employing an applied voltage that is up to a voltage surpassing 10V to profile carrier concentration, and clearing away the metal Ga electrode after the profiling.

Another mode as defined by the present invention is characterized in that carrier concentration in a wafer including an In-containing-compound semiconductor surface layer is non-invasively profiled, and in that the wafer can be employed as it is, after its carrier concentration has been non-invasively profiled, for use in device processing. Here, this wafer may be one that has been profiled by any of the above-described non-invasive carrier-concentration profiling techniques.

In accordance with the present invention, carrier concentration/distribution within an In-containing compound semiconductor wafer may be non-invasively profiled to a depth of several μm in a short time and with a high degree of accuracy, and the profiled wafer itself may be provided for use directly in device fabrication.

From the following detailed description in conjunction with the accompanying drawings, the foregoing and other objects, features, aspects and advantages of the present invention will become readily apparent to those skilled in the art.

DETAILED DESCRIPTION

Embodiment 1

In a carrier concentration profiling method under a first embodiment, an improved electrochemical C/V technique is employed. A rebuilt version of the device in FIG. 2 may be utilized as the C/V analyzer for the improved electrochemical C/V technique. In particular, the electrical analyzing unit 6 was reformed to enable it to apply in excess of 10V and up to 60V as a reverse-bias applied voltage. Further, inasmuch as photo-etching is unnecessary in the present invention, the light-receiving window $1b$ on the cell 1 is not required.

An aqueous solution of EDTA (ethylene diamine tetraacetic acid) is utilized as an electrolyte $2'$. The electrolyte $2'$ preferably contains 80 or more percent by mass EDTA. The reason why is because electrolysis of the water is thereby prevented when high voltage has been applied.

The carrier concentration/distribution in a compound semiconductor wafer utilized in fabricating optical communications devices was actually profiled in accordance with the present embodiment. The compound semiconductor wafer included, epitaxially grown in turn on an indium phosphate (InP) wafer: an InP layer of approximately 1 μm thickness, an indium-gallium arsenide (InGaAs) layer of approximately 3 μm thickness, and an InP layer of approximately 2 μm thickness.

The epitaxial layers contained up to $1 \times 10^{16}$ cm$^{-3}$ dopant throughout. The FIG. 1 graph plots the results of profiling the carrier concentration/distribution in this compound semiconductor wafer. In the graph, from the surface of the wafer up to the depth of about 1 μm there is no curved line showing carrier concentration, because there is a surface depletion layer through that depth.

Figure 1:
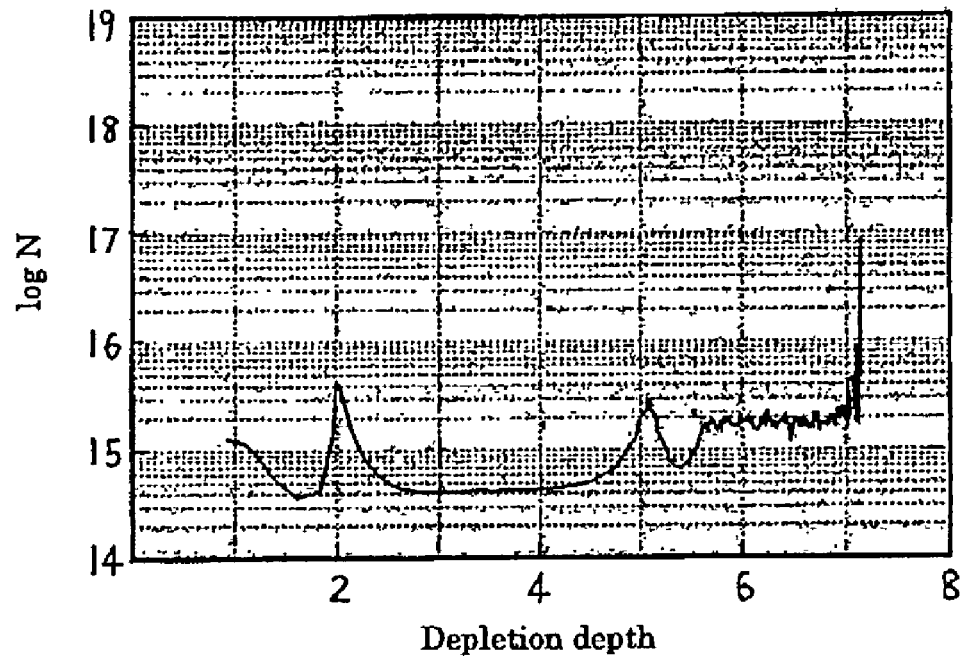
FIG. 1 is a graph plotting results of profiling, according to one mode of embodying the present invention, carrier concentration within a compound semiconductor wafer.

In particular, the horizontal scale in the FIG. 1 graph indicates the depth w(μm) from the surface of the epitaxial layers on, to the edge of the depletion layer in, the compound semiconductor wafer; while the vertical scale indicates the $\log_{10}$ (common logarithm) of the carrier concentration N(cm$^3$) through the depth w. From this graph it may be confirmed that any one of the epitaxial layers had a carrier concentration of under $1 \times 10^{16}$ cm$^{-3}$. It may likewise be confirmed that carrier concentration peaks are formed in positions corresponding to the locations of heterojunction interfaces that are at 2 μm and 5 μm from the wafer surface.

The profiling data in FIG. 1 was obtainable with an approximately 10-minute measurement. Furthermore, the FIG. 1 data is about the same as what would take 3 hours to profile while photo-etching using an aqueous HCl solution. On the other hand, inasmuch as photo-etching is not needed with the present invention, incidents of etching unevenness that require changing the measuring locale do not occur. What is more, profiling errors due to etching unevenness can be eliminated.

It should be noted that in terms of the present embodiment, despite not photo-irradiating, slight etching on the order of 0.1 nm thickness was actually observed. Nevertheless, device evaluation confirmed that in actual practice slight etching in this way does not affect device processing. In short, a carrier concentration profiling method according to the present invention is non-invasive, whereby directly profiled wafers can themselves serve in device fabrication.

Embodiment 2

Embodiment 2 is similar to Embodiment 1, except in differing from Embodiment 1 only in that the electrolyte electrode was changed from an aqueous EDTA solution to an aqueous tiron solution. (Tiron has the molecular formula: $C_6H_2(OH)_2(SO_3Na)_2 \cdot H_2O$.)

Carrier concentration within GaAs compound semiconductor wafers has in the conventional art been profiled utilizing an electrode of aqueous tiron solution while photo-etching. However, because InP-compound semiconductor wafers cannot be photo-etched with aqueous tiron solution, aqueous tiron solution has not been utilized for profiling carrier concentration within InP-compound semiconductor wafers. Nevertheless, the present inventors, by exploiting in reverse the fact that InP-compound semiconductor wafers are not photo-etched in aqueous tiron solution, succeeded in non-invasively profiling carrier concentration in InP-compound semiconductor wafers to great depths from the surface.

Embodiment 3

Embodiment 3 is similar to Embodiments 1 and 2, except in differing from Embodiments 1 and 2 only in that the electrolyte electrode was changed to a metal Ga-melt electrode.

Inasmuch as its melting point is an extremely low 29° C., Ga may be employed as a liquid electrode that does not produce effects on compound semiconductor wafers. Here, although the use of mercury as a liquid-metal electrode is conceivable, being that its toxicity is hazardous to human beings, and that from a safety viewpoint handling problems are liable to arise, mercury cannot be said to be desirable as a liquid electrode.

Embodiment 4

Figure 2:
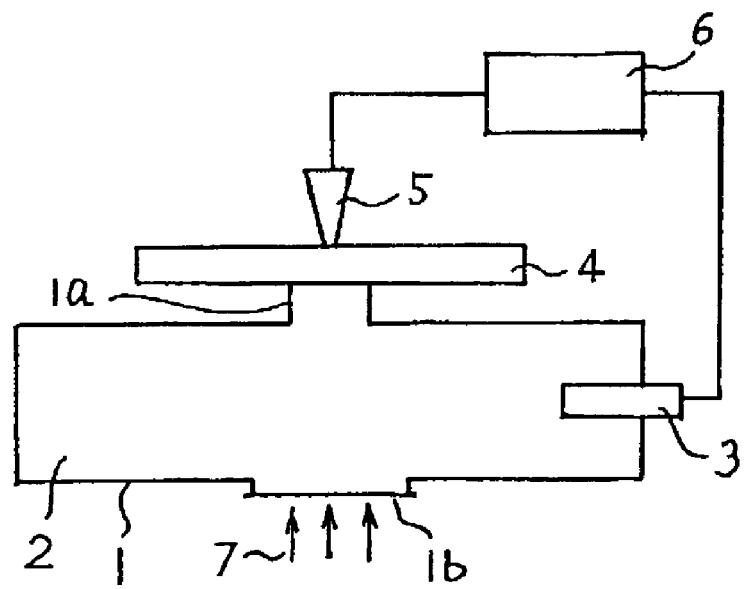
FIG. 2 is a schematic block diagram representing one example of a conventional C/V analyzer.

Embodiment 4 is similar to Embodiment 3 in that metal Ga is employed as an electrode. In Embodiment 4, however, a cell 1 like that illustrated in FIG. 2 is made unnecessary. In the carrier-concentration profiling method of Embodiment 4, to begin with a metal-Ga melt is soaked into a sponge-like retaining material. The retaining material is then contacted on the surface of a compound semiconductor wafer. Thus the wafer surface is wetted by and put in contact with the metal-Ga melt soaked into the sponge-like retaining material. The metal-Ga melt in this situation is then solidified, forming on the compound semiconductor wafer surface a solid metal-Ga electrode running along the sponge-like retaining material.

After utilizing the solid metal-Ga electrode to profile carrier concentration within the compound semiconductor wafer, the solid metal-Ga electrode is made molten once more to clear it from the wafer surface. The wafer from which the metal-Ga electrode has been cleared is itself then made available for device fabrication. In short, in terms of this embodiment as well, carrier concentration in a compound semiconductor wafer may be non-invasively profiled.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

The invention claimed is:

1. A non-invasive, semiconductor-wafer carrier concentration profiling method, comprising steps of:
    equipping a C/V analyzer with a light-receiving-windowless electrolyte cell having an opening for electrolyte-wafer contact;
    filling the cell with a liquid electrode;
    preparing a semiconductor wafer composed of an In-containing compound and superficially onto which at least one In-containing-compound semiconductor layer has been heteroepitaxially grown;
    placing said wafer on said opening in the electrolyte cell so as to put the liquid in superficial contact with the wafer to allow the liquid to function as an electrode; and
    employing applied voltages, including at least a maximum voltage that surpasses 10V but is not greater than about 60V, to profile the wafer's C/V characteristics.

2. The carrier concentration profiting method set forth in claim 1, wherein an aqueous EDTA solution is utilized as the liquid electrode.

3. The carrier concentration profiling method set forth in claim 2, wherein the aqueous EDTA solution contains 80% or more EDTA.

4. The carrier concentration profiling method set forth in claim 1, wherein liquid tiron is utilized as the liquid electrode.

5. The carrier concentration profiling method set forth in claim 1, wherein a metal Ga melt is utilized as the liquid electrode.

* * * * *